United States Patent
Park et al.

(10) Patent No.: US 11,430,852 B2
(45) Date of Patent: Aug. 30, 2022

(54) DISPLAY DEVICE HAVING COMPONENT AREA WITH CROSSING SIGNAL LINES AND METHOD OF MANUFACTURING THE SAME

(71) Applicant: Samsung Display Co., Ltd., Yongin-si (KR)

(72) Inventors: Gyungsoon Park, Yongin-si (KR); Jinseon Kwak, Yongin-si (KR); Seonyoung Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 93 days.

(21) Appl. No.: 16/926,843

(22) Filed: Jul. 13, 2020

(65) Prior Publication Data
US 2021/0193773 A1   Jun. 24, 2021

(30) Foreign Application Priority Data
Dec. 18, 2019  (KR) .......................... 10-2019-0170051

(51) Int. Cl.
*H01L 27/14*   (2006.01)
*H01L 27/32*   (2006.01)
*H01L 51/56*   (2006.01)

(52) U.S. Cl.
CPC ...... *H01L 27/3276* (2013.01); *H01L 27/3262* (2013.01); *H01L 27/3265* (2013.01); *H01L 51/56* (2013.01)

(58) Field of Classification Search
CPC ............. H01L 27/3276; H01L 27/3262; G02F 1/13454
See application file for complete search history.

(56) References Cited

U.S. PATENT DOCUMENTS

| | | | |
|---|---|---|---|
| 7,830,591 B2 | 11/2010 | Shimodaira | |
| 9,940,888 B2 | 4/2018 | Ryoo et al. | |
| 10,134,826 B2 | 11/2018 | Ka et al. | |
| 10,466,822 B2 | 11/2019 | Kim et al. | |
| 2004/0150771 A1* | 8/2004 | Lee | G02F 1/1368 349/114 |
| 2012/0153286 A1* | 6/2012 | Yoon | H01L 27/326 257/59 |
| 2013/0135328 A1 | 5/2013 | Rappoport et al. | |
| 2017/0069871 A1* | 3/2017 | Yim | H01L 27/3258 |
| 2019/0196635 A1 | 6/2019 | Park et al. | |
| 2019/0245029 A1 | 8/2019 | Ka et al. | |
| 2020/0174301 A1* | 6/2020 | Tien | H04N 5/2257 |

FOREIGN PATENT DOCUMENTS

| | | |
|---|---|---|
| KR | 1020170117291 A | 10/2017 |
| KR | 1020180050473 A | 5/2018 |
| KR | 1020180063633 A | 6/2018 |

* cited by examiner

*Primary Examiner* — Phuc T Dang
(74) *Attorney, Agent, or Firm* — Cantor Colburn LLP

(57) ABSTRACT

A display device includes a substrate including a display area including a plurality of pixels; and a transmission area inside the display area and corresponding to a component which uses light or sound to perform a function relative to the display device; and a plurality of signal lines on the substrate and connected to the plurality of pixels. The plurality of signal lines pass through the transmission area of the substrate to be connected to the plurality of pixels in the display area.

18 Claims, 12 Drawing Sheets

DISPLAY DEVICE HAVING COMPONENT AREA WITH CROSSING SIGNAL LINES AND METHOD OF MANUFACTURING THE SAME

This application claims priority to Korean Patent Application No. 10-2019-0170051, filed on Dec. 18, 2019, and all the benefits accruing therefrom under 35 U.S.C. § 119, the disclosure of which is incorporated herein in its entirety by reference.

BACKGROUND

1. Field

One or more embodiments relate to a display device and a method of manufacturing the same.

2. Description of the Related Art

The usage of display devices has diversified. In particular, the thicknesses and weights of display devices have decreased, and thus, the range of use thereof is widening.

As display devices are being utilized in various ways, the shapes of the display devices may be designed in various ways. Also, functions that may be combined with or linked to display devices have increased.

SUMMARY

One or more embodiments include a display device having a transmission area corresponding to a component, such as a camera and arranged in a display area, and a method of manufacturing the same. In particular, one or more embodiments include an enhanced display device in which a dead space around the transmission area within the display area may be reduced, and a method of manufacturing the same. However, these objectives are just examples, and the scope of the present disclosure is not limited thereby.

Additional features will be set forth in part in the description which follows and, in part, will be apparent from the description, or may be learned by practice of the presented embodiments of the disclosure.

According to one or more embodiments, a display device includes a substrate including a display area including a plurality of pixels; and a transmission area inside the display area and corresponding to a component which uses light or sound to perform a function relative to the display device; and a plurality of signal lines on the substrate and connected to the plurality of pixels. The plurality of signal lines passes through the transmission area of the substrate to be connected to the plurality of pixels in the display area.

The plurality of signal lines may include a first line passing through the transmission area in a first direction and a second line passing through the transmission area in a second direction different from the first direction.

The first line and the second line may form a mesh shape in the transmission area, and the mesh shape may include any one of a checkered-type mesh shape, a rhombus-type mesh shape, a square brickwork-type mesh shape, a rectangular brickwork-type mesh shape, and a honeycomb-type mesh shape.

The first line may include an initialization voltage line which provides an initialization voltage to each of the pixels, a scan line which provides a scan signal to each pixel, and an emission control line which provides an emission control signal to each pixel.

At least one of the initialization voltage line, the scan line, and the emission control line may be arranged on a different layer.

A pixel in the display area may include a semiconductor layer on the substrate, a gate electrode facing the semiconductor layer, an upper electrode forming a capacitor together with the gate electrode, a source electrode and a drain electrode each connected to the semiconductor layer, and a contact metal layer connected to the drain electrode, and the scan line and the emission control line may be formed of the same material on the same layer as the gate electrode, and the initialization voltage line may be in a same layer as the upper electrode.

The second line may include a driving voltage line which provides a driving voltage to each pixel, and a data line which provides a data signal to each pixel.

The driving voltage line and the data line may be arranged in different layers.

A pixel in the display area may include a semiconductor layer on the substrate, a gate electrode facing the semiconductor layer, an upper electrode forming a capacitor together with the gate electrode, a source electrode and a drain electrode each connected to the semiconductor layer, and a contact metal layer connected to the drain electrode, and the data line may be formed of the same material on the same layer as the source electrode and the drain electrode, and the driving voltage line may be in a same layer as the contact metal layer.

Each of the signal lines may include portions in different layers on the substrate, along a thickness direction of the substrate, and the portions which are in the different layers, are spaced apart from each other along the substrate.

According to one or more embodiments, a method of manufacturing a display device, includes providing a component which uses light or sound to perform a function relative to the display device; providing a substrate including a display area including; and a transmission area inside the display area and corresponding to a component which uses light or sound to perform a function relative to the display device; and providing a plurality of signal lines connected to the plurality of pixels in the display area, the plurality of signal lines passing through the transmission area which is inside the display area.

The plurality of signal lines may include a first line passing through the transmission area in a first direction and a second line passing through the transmission area in a second direction different from the first direction.

The first line and the second line may form a mesh shape in the transmission area, and the mesh shape may include any one of a checkered-type mesh shape, a rhombus-type mesh shape, a square brickwork-type mesh shape, a rectangular brickwork-type mesh shape, and a honeycomb-type mesh shape.

The first line may include an initialization voltage line which provides an initialization voltage to each of the pixels, a scan line which provides a scan signal to each pixel, and an emission control line which provides an emission control signal to each pixel.

At least one of the initialization voltage line, the scan line, and the emission control line may be in a different layer from another one among the initialization voltage line, the scan line and the emission control line.

A pixel in the display area may include a semiconductor layer on the substrate, a gate electrode facing the semiconductor layer, an upper electrode forming a capacitor together with the gate electrode, a source electrode and a drain electrode each connected to the semiconductor layer, and a contact metal layer connected to the drain electrode, and the scan line and the emission control line may be formed of the same material on the same layer as the gate electrode, and the initialization voltage line may be in a same layer as the upper electrode.

The second line may include a driving voltage line which provides a driving voltage to each pixel, and a data line which provides a data signal to each pixel.

The driving voltage line and the data line may be arranged in different layers.

A pixel in the display area may include a semiconductor layer on the substrate, a gate electrode facing the semiconductor layer, an upper electrode forming a capacitor together with the gate electrode, a source electrode and a drain electrode each connected to the semiconductor layer, and a contact metal layer connected to the drain electrode, and the data line may be in a same layer as the source electrode and the drain electrode, and the driving voltage line may be in a same layer as the contact metal layer.

Each of the signal lines may include portions in different layers on the substrate, along a thickness direction of the substrate, and the portions which are in the different layers, are spaced apart from each other along the substrate.

Other features, and advantages than the above-described features, and advantageous will be apparent from the following drawings, the claims, and a detailed description of the disclosure.

BRIEF DESCRIPTION OF THE DRAWINGS

The above and other features, and advantages of embodiments of the disclosure will be more apparent from the following description taken in conjunction with the accompanying drawings, in which.

DETAILED DESCRIPTION

Figure 1:
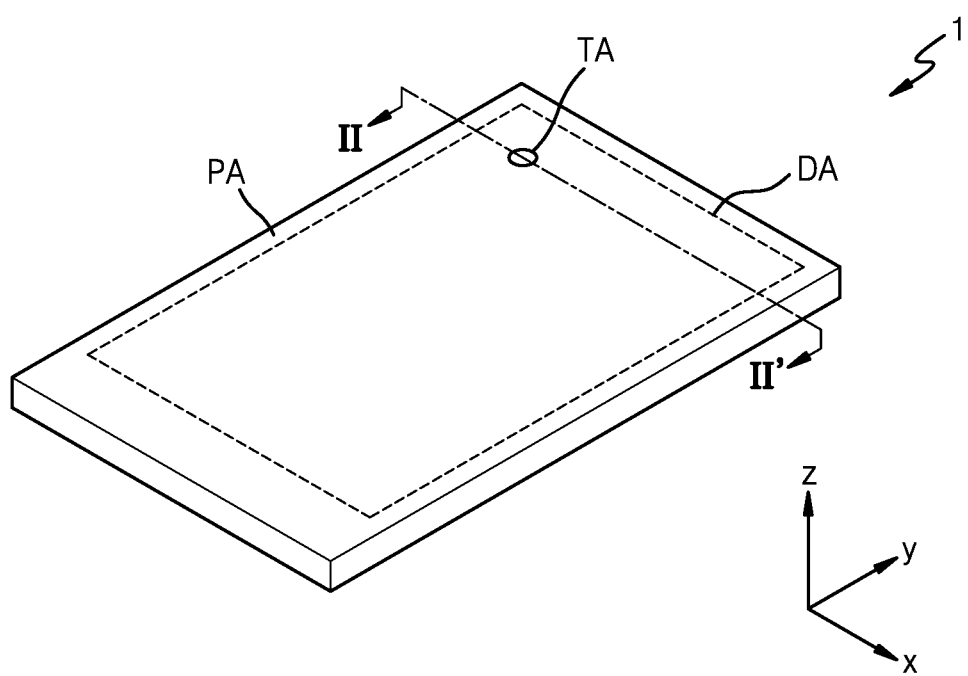
FIG. 1 is a perspective view schematically illustrating an embodiment of a display device.

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. Accordingly, the embodiments are merely described below, by referring to the figures, to explain features of the present description.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terminology used herein is for the purpose of describing particular embodiments only and is not intended to be limiting. As used herein, the singular forms "a," "an" and "the" are intended to include the plural forms as well, unless the context clearly indicates otherwise. For example, "an element" has the same meaning as "at least one element," unless the context clearly indicates otherwise. "At least one" is not to be construed as limiting "a" or "an." "Or" means "and/or."

It will be further understood that the terms "comprises" and/or "comprising" used herein specify the presence of stated features or components, but do not preclude the presence or addition of one or more other features or components.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Sizes of elements in the drawings may be exaggerated or reduced for convenience of explanation. In other words, since sizes and thicknesses of components in the drawings are arbitrarily illustrated for convenience of explanation, the following embodiments are not limited thereto.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

When an embodiment may be implemented differently, a specific process order may be performed differently from the described order. For example, two consecutively described processes may be performed substantially at the same time or performed in an order opposite to the described order.

FIG. 1 is a perspective view schematically illustrating an embodiment of a display device 1.

Referring to FIG. 1, a display device 1 includes a transmission area TA and a display area DA which is adjacent to the transmission area TA. In an embodiment, the display area DA may surround the transmission area TA, in a top plan view of the display device 1, such that an entirety of the transmission area TA is within a planar area of the display area DA. The display device 1 may provide an image by using light generated and/or emitted from a display pixel such as a pixel P provided in plurality (e.g., a plurality of pixels P) arranged in the display area DA. FIG. 1 illustrates that one of the transmission area TA is inside the display area DA. The transmission area TA may be surrounded by a plurality of pixels P (see FIG. 4) in the display area DA. That is, the transmission area TA may not include a pixel P, such that an image is not displayed at the transmission area TA. The transmission area TA may be considered a non-display region or area, as compared to the display area DA which is a display region.

Figure 2:
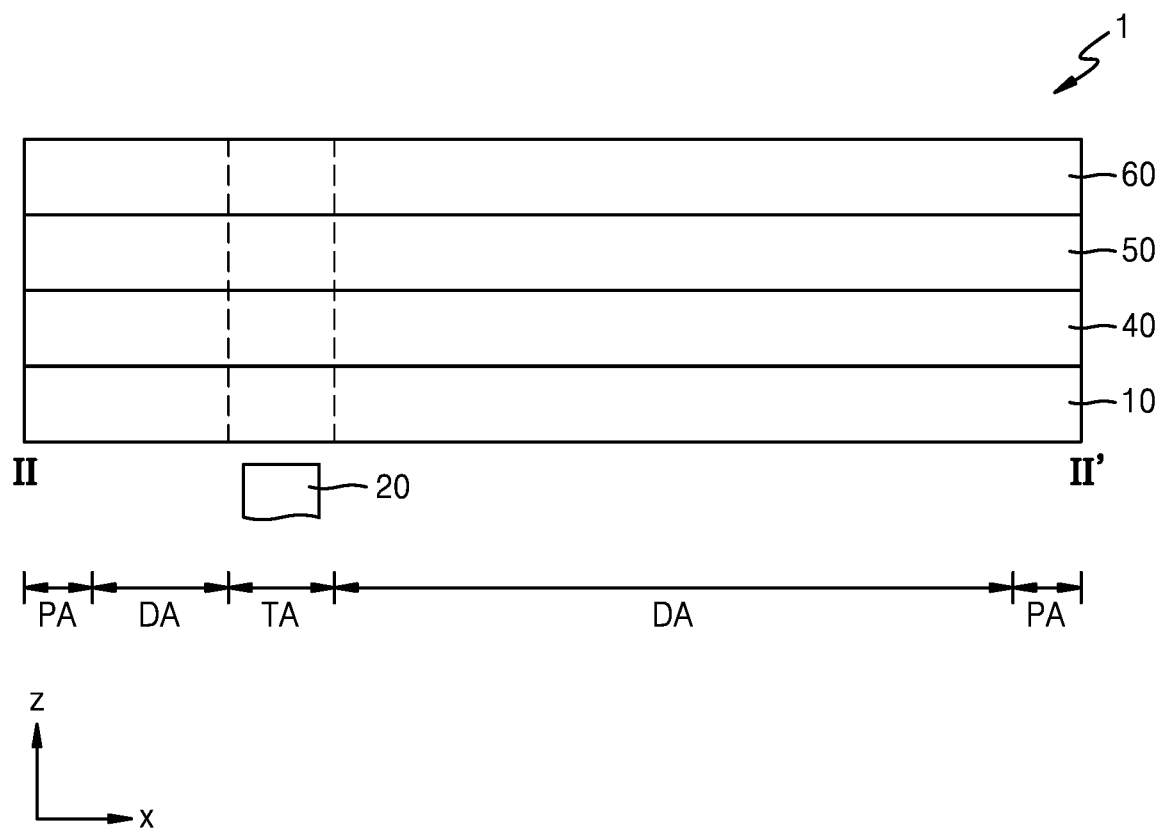
FIG. 2 is a cross-sectional view taken along line II-II' of FIG. 1.

The transmission area TA may be a planar area corresponding to a planar area in which a component 20 to be described later with reference to FIG. 2 is arranged. Various components of the display device 1 may include a transmission area TA and a display area DA corresponding to those described above for the display device 1, without being limited thereto. That is, various components of the display device 1 may include one or more corresponding features corresponding to those described related to the display device 1.

The display device 1 and various components thereof may be defined in a plane defined by a first direction and a second direction which cross each other. In FIG. 1, for example, the x-direction and the y-direction may variously represent the first direction or the second direction. A thickness direction may be taken along a third direction which intersects the plane defined by the first direction and the second direction. In FIG. 1, for example, the z-direction may represent the third direction.

Lines (e.g., conductive lines or signal lines) connected to the pixels P inside the display area DA pass through the transmission area TA. The layout structure of lines relative to the transmission area TA will be described later in detail.

Hereinafter, an organic light-emitting display device is described as an example of a display device 1. However, the display device 1 according to the present disclosure is not limited thereto. In another embodiment, the display device 1 may be a display device 1, such as an inorganic light-emitting display device or a quantum dot light-emitting display device. In an embodiment, for example, an emission layer of a display element OLED provided in the display device 1 may include an organic material, an inorganic material, a quantum dot, an organic material and a quantum dot, or an inorganic material and a quantum dot.

FIG. 1 illustrates that one of the transmission area TA is present and has an approximately circular planar shape. However, embodiments are not limited thereto. The number of the transmission area TA may be two or more (e.g., transmission areas TA). Planar shapes of two or more of the transmission areas TA may be variously modified as a circular shape, an oval shape, a polygonal shape, a star shape, a diamond shape and the like.

FIG. 2 is an enlarged cross-sectional view schematically illustrating the display device 1. FIG. 2 corresponds to a cross-section along line II-II of FIG. 1.

Referring to FIG. 2, the display device 1 may include a display panel 10, an input sensing layer 40 arranged on the display panel 10 and an optical functional layer 50, which may be covered by a window 60. The display panel 10 may face the window 60 with the input sensing layer 40 and the optical functional layer 50 therebetween. The display device 1 may be or may be included in a variety of electronic devices which have an image display function, such as mobile phones, laptop computers, smart watches and the like.

The display panel 10 may display an image. The display panel 10 may include pixels P arranged in the display area DA. The display area DA may be a planar area at which light is generated and/or emitted, the image is generated and/or displayed, etc. The pixels may include a display element OLED and a pixel circuit PC which is connected to the display element OLED. The display element OLED may include an organic light-emitting diode or a quantum dot organic light-emitting diode, without being limited thereto.

The input sensing layer 40 may attain coordinate information according to an external input to the display device 1 or component thereof, for example, according to a touch event. The input sensing layer 40 may include a sensing electrode or touch electrode, and trace lines which are connected to the sensing electrode or touch electrode. The input sensing layer 40 may be arranged on the display panel 10. The input sensing layer 40 may sense the external input by using a mutual capacitance method or/and a self-capacitance method.

The input sensing layer 40 may be provided or formed directly on the display panel 10, or may be separately provided or formed and then may be coupled to the display panel 10 such as by using a fixing member like an adhesive layer. The adhesive layer may include an optically clear adhesive. In an embodiment, for example, the input sensing layer 40 may be consecutively provided or formed after a process of providing or forming the display panel 10 is performed. In this case, the input sensing layer 40 may be understood as part of the display panel 10, and no adhesive layer may be between the input sensing layer 40 and the display panel 10. In FIG. 2, the input sensing layer 40 is between the display panel 10 and the optical functional layer 50. However, in another embodiment, the input sensing layer 40 may be arranged above the optical functional layer 50. That is, the display panel 10 may face the input sensing layer 40 with the optical functional layer 50 therebetween.

The optical functional layer 50 may include an antireflective layer. The antireflective layer may reduce the reflectivity of light (external light) incident toward the display panel 10 from the outside through the window 60. The antireflective layer may include a phase retarder and a polarizer. The phase retarder may be of a film type or liquid crystal coating type, and may include a λ/2 phase retarder and/or a λ/4 phase retarder. The polarizer may also be of a film-type or liquid crystal coating-type. The film-type polarizer may include an elongation-type synthetic resin film, and the liquid crystal coating-type polarizer may include liquid crystals in an arrangement. The phase retarder and the polarizer may further include a protective film. The protective film of the phase retarder and the polarizer may be defined as a base layer of the antireflective layer.

In another embodiment, the antireflective layer may include a black matrix and/or color filters. The color filters may be arranged considering colors of lights emitted from the pixels P of the display panel 10. Each of the color filters may include a red, green or blue material such as a pigment or dye. Alternatively, each of the color filters may further include a quantum dot in addition to the pigment or dye described above. Alternatively, a portion of the color filters may not include the pigment or dye described above and may include light scattering particles, such as titanium oxide.

In another embodiment, the antireflective layer may include a destructive interference structure. The destructive interference structure may include a first reflective layer and a second reflective layer, which are arranged in different layers from each other along a thickness direction of the antireflective layer. First reflected light and second reflected light reflected from the first reflective layer and the second reflective layer, respectively, may destructively interfere. Thus, the reflectivity of external light may be reduced.

The optical functional layer 50 may include a lens layer. The lens layer may improve emission efficiency of light emitted from the display panel 10 or may reduce color deviation. The lens layer may include a layer having a concave or convex lens shape or/and a plurality of layers having different refractive indices. The optical functional layer 50 may include the antireflective layer and the lens layer described above or one thereof.

In an embodiment, the optical functional layer 50 may be consecutively provided or formed after a process of providing or forming the display panel 10 and/or the input sensing layer 40 is performed. In this case, no adhesive layer may be respectively between the optical functional layer 50, the display panel 10 and/or the input sensing layer 40.

The transmission area TA may be a component area which corresponds to a component 20 adding various functions to the display device 1, as described above. The component 20 may be arranged outside of the display panel 10, such below the display panel 10 as shown in FIG. 2. In an embodiment, for example, the component 20 may be arranged at a side of the display device 1 which is opposite to a viewing side of the display device 1 (e.g., viewing side at the window 60).

The component 20 may include an electronic element or electronic device. In an embodiment, for example, the component 20 may be an electronic element that uses light and/or sound to perform a function relative to the display device 1. The function may be linked to the display device 1. In an embodiment, for example, the electronic element may include a sensor that performs a function of outputting or/and receiving light, such as an infrared sensor, a camera that performs a function of receiving light so as to capture an image, a sensor that performs a function to output and/or sense light or sound so as to measure a distance of an object from the display device 1 or to recognize a finger print applied to the display device 1, a small lamp that performs a function to output light to outside the display device 1, or a speaker that functions to output sound to outside the display device 1. An electronic element that uses light may use light within various wavelength bands, such as visible rays, infrared rays and ultraviolet ("UV") rays. In some embodiments, the transmission area TA may be understood as a planar area in which light or/and sound output from the component 20 to outside the display device 1 or proceeding toward the electronic element from outside the display device 1, may transmit.

In another embodiment, when the display device 1 is used as a smart watch or a car instrument panel, the component 20 may be a member, such as a watch needle or a needle for indicating information (for example, car speed). Since light may proceed toward the electronic element from outside the display device 1, the member may be visible from outside the display device 1 such as from a viewing side thereof.

The component 20 may relate to the function of the display panel 10, as described above, or a component, such as an accessory for increasing an esthetic sense of the display panel 10. Although not shown in FIG. 2, an optically clear adhesive may be between the window 60 and the optical functional layer 50 to attach the window 60 and the optical functional layer 50 to each other.

Figure 3A:
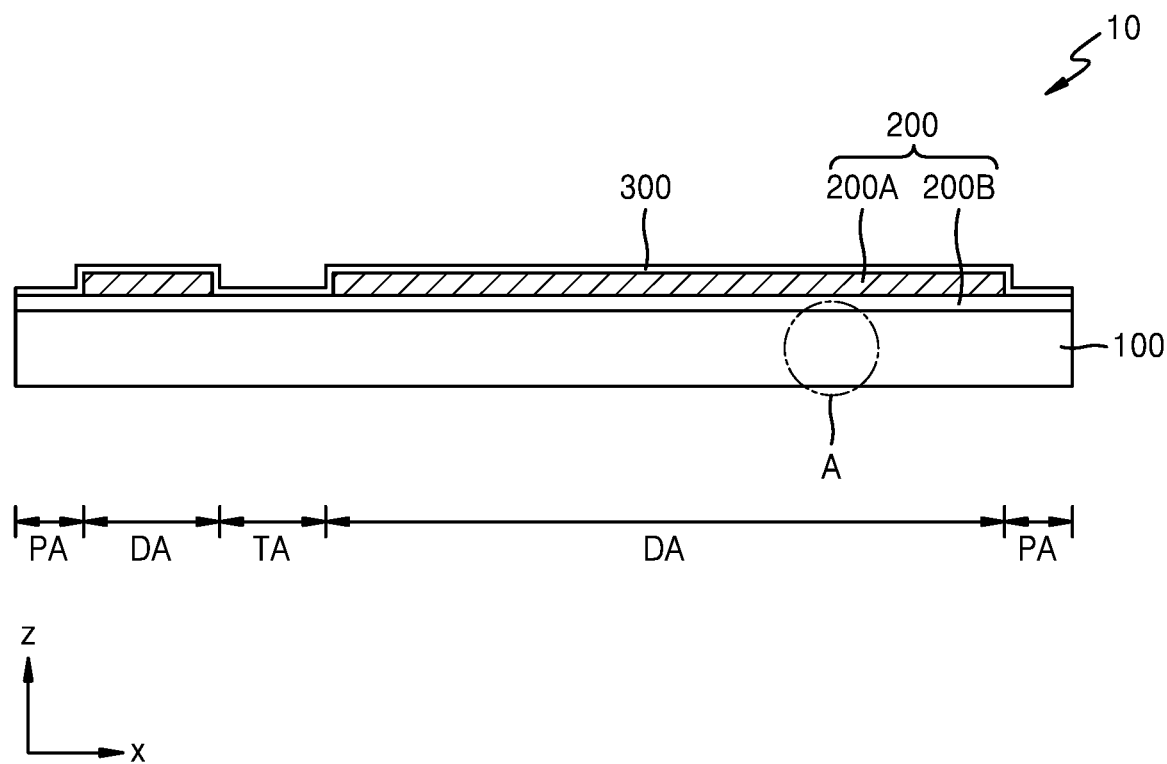
FIGS. 3A and 3B are cross-sectional views of an embodiment of a display panel shown in FIG. 2.
Figure 3B:
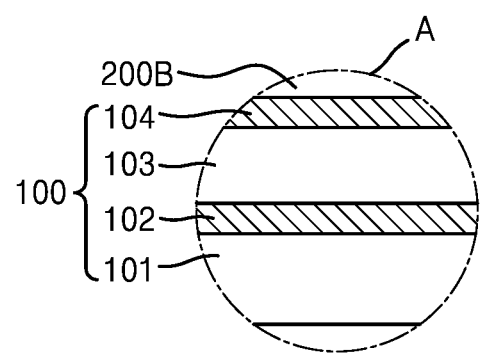

FIG. 3A is a cross-sectional view schematically illustrating an embodiment of the display panel 10. FIG. 3B is an enlarged cross-sectional view of region A in FIG. 3A.

Referring to FIG. 3A, the display panel 10 may include a display layer 200 arranged on a substrate 100. The substrate 100 may include a glass material or polymer resin. The substrate 100 may have a multi-layer structure. In an embodiment, for example, the substrate 100 may include a first base layer 101, a first barrier layer 102, a second base layer 103, and a second barrier layer 104, as shown in the enlarged cross-sectional view of FIG. 3B.

Each of the first base layer 101 and the second base layer 103 may include polymer resin. In an embodiment, for example, the first base layer 101 and the second base layer 103 may include polymer resin, such as polyethersulfone ("PES"), polyarylate ("PAR"), polyetherimide ("PEI"), polyethyelenene napthalate ("PEN"), polyethyelene-terepthalate ("PET"), polyphenylene sulfide ("PPS"), polyimide ("PI"), polycarbonate ("PC"), cellulose acetate triacetate ("TAC"), or cellulose acetate propionate ("CAP"). The first base layer 101 and the second base layer 103 may include transparent polymer resin.

The first barrier layer 102 and the second barrier layer 104 that are barrier layers for reducing or effectively preventing penetration therethrough of external foreign substances may have a single layer or multi-layer structure including an inorganic material, such as silicon nitride or silicon oxide.

The display layer 200 may include a plurality of pixels P. The display layer 200 may include a display element layer 200A including a display element OLED provided in plurality (e.g., display elements) arranged corresponding to the plurality of pixels P, a pixel circuit layer 200B including a pixel circuit PC arranged corresponding to the pixels P and various insulating layers. Each pixel P may include a display element OLED and a pixel circuit PC which is connected to the display element OLED. Each pixel circuit PC may include a transistor and a storage capacitor. Each display element OLED may include an organic light-emitting diode without being limited thereto.

The display elements of the display layer 200 may be covered by an encapsulation member (e.g., encapsulation layer), such as a thin-film encapsulation layer 300. The thin-film encapsulation layer 300 may include at least one inorganic encapsulation layer and at least one organic encapsulation layer. When the display panel 10 includes a substrate 100 including polymer resin and a thin-film encapsulation layer 300 including an inorganic encapsulation layer and an organic encapsulation layer, the flexibility of the display panel 10 may be enhanced.

Referring to FIG. 3A, there is no through hole defined in the substrate 100 which corresponds to the transmission area TA. The display element layer 200A and the thin-film encapsulation layer 300 are provided or formed above the transmission area TA of the substrate 100 and include materials having transparency to a signal such as light and/or sound such that the materials do not disturb a signal flow function between the component and the outside of the component 20, such as the camera described above. In an embodiment, the transmission area TA as a non-display area inside the display area DA, is a planar area corresponding to the component, and at which a signal is transmittable through the substrate 100 and layers thereon, relative to the component 20.

Figure 4:
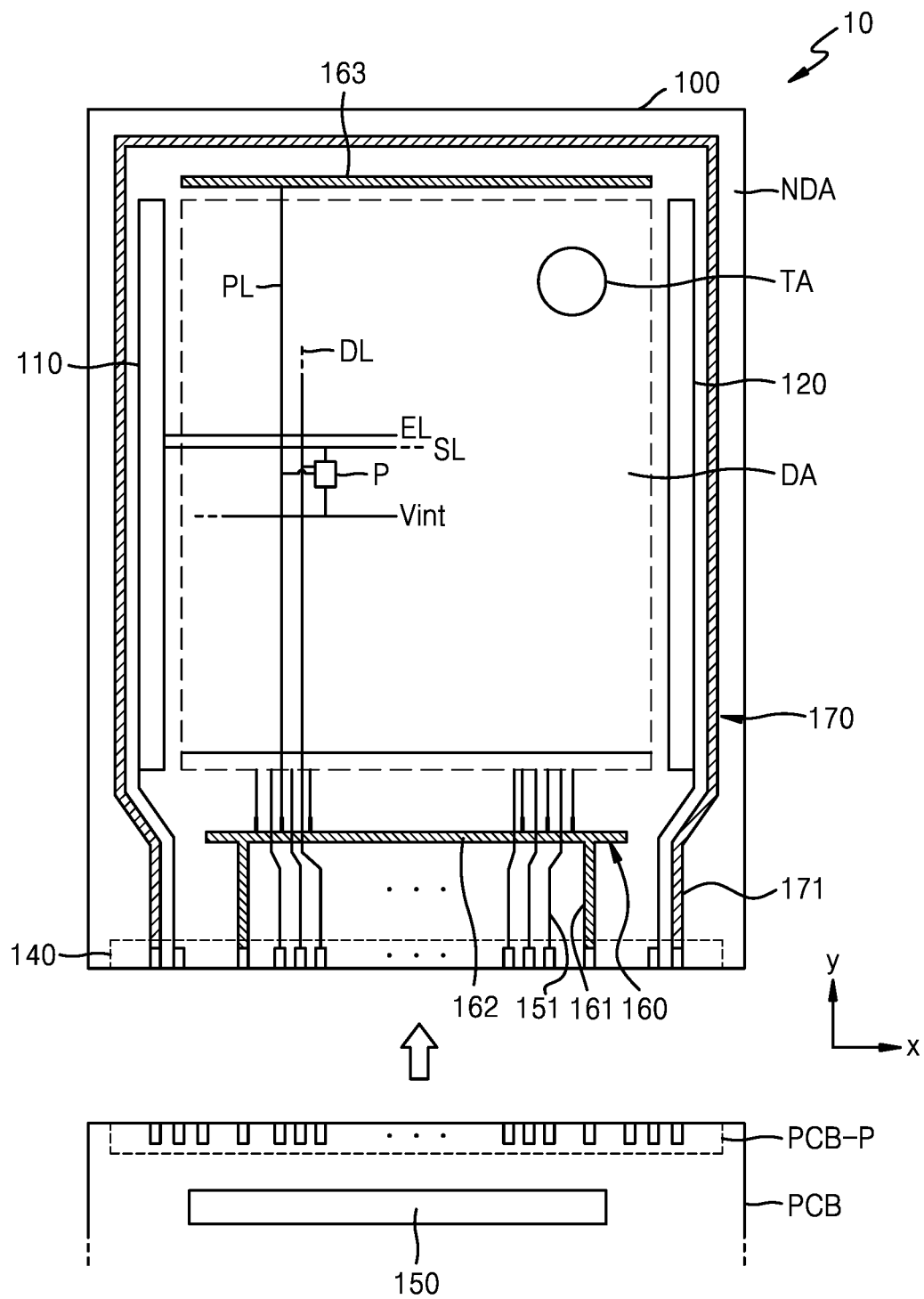
FIG. 4 is a plan view schematically illustrating an embodiment of a display panel shown in FIG. 3A.

FIG. 4 is a top plan view schematically illustrating an embodiment of the display panel 10.

Referring to FIG. 4, the display panel 10 may include a plurality of pixels P arranged in the display area DA. Each of the plurality of pixels P may include a display element OLED, such as an organic light-emitting diode. Each pixel P may emit a red, green, blue, or white light, for example, from the organic light-emitting diode. A pixel P used herein may be understood as a pixel P that emits light of one of red, green, blue, and white colors, as described above. The display area DA may be covered by the thin-film encapsulation layer 300 described above with reference to FIG. 3A and thus may be protected from external air or moisture.

The transmission area TA may be within the display area DA, and a plurality of pixels P may be arranged around the transmission area TA. The transmission area TA may be provided or formed to be inclined to one side of the display area DA, such as at a top end of the display area DA, as shown in FIG. 1 or 4. The transmission area TA may be provided or formed in the middle of the display area DA. The plurality of pixels P may be arranged to surround the transmission area TA, and a variety of lines (e.g., conductive lines or signal lines) may pass through the transmission area TA. This line structure will be described below with reference to FIG. 6A and FIG. 6B, as mentioned above.

Each pixel P is electrically connected to outer circuits arranged in a non-display area NDA that corresponds to a peripheral area PA of FIG. 1. The non-display area NDA may be a planar area at which light is not emitted and/or an image is not displayed. A first scan driving circuit 110 (e.g., first driving circuit or first driver), a second scan driving circuit 120 (e.g., second driving circuit or second driver), a first terminal 140 (e.g., first terminal area), a data driving circuit 150 (e.g., third driving circuit or third driver), a first power supply line 160, and a second power supply line 170 may be arranged in the non-display area NDA.

The first scan driving circuit 110 may provide an electrical signal such as a scan signal Sn to each pixel P through a signal line such as a scan line SL. The first scan driving circuit 110 may provide an electrical signal such as an emission control signal En (e.g., light emission control signal) to each pixel P through an emission control line EL (e.g., a light emission control line). The second scan driving circuit 120 may be arranged parallel with the first scan driving circuit 110 with the display area DA therebetween. A first portion of the pixels P (e.g., first pixels) arranged in the display area DA may be electrically connected to the first scan driving circuit 110, and a second portion of the pixels P which excludes the first portion (e.g., second pixels) may be connected to the second scan driving circuit 120.

A first terminal 140 may be arranged at one side of the substrate 100. The first terminal 140 may not be covered by an insulating layer but may be exposed to outside the display panel 10 for electrical connection to an external component such as a printed circuit board PCB. The first terminal 140 may include a terminal pad provided in plurality and through which an electrical signal is provided to the display panel 10 from outside thereof.

A second terminal PCB-P (e.g., second terminal area) of the printed circuit board PCB may be electrically connected to the first terminal 140 of the display panel 10. The second terminal PCB-P may include a terminal pad provided in plurality and through which an electrical signal is provided to the display panel 10 from outside thereof. The printed circuit board PCB may transmit an electrical signal such as a driving signal, a control signal or power of a controller (not shown) to the display panel 10. A control signal generated by the controller may be transmitted to each of the first scan driving circuit 110 and the second scan driving circuit 120, through the printed circuit board PCB. The controller may provide first power supply voltage ELVDD and a second power supply voltage ELVSS (see FIG. 5 that will be described later) to first power supply line 160 and the second power supply line 170, via a first connection line 161 and a second connection line 171, respectively. The first power supply voltage ELVDD may be provided to each pixel P via a driving voltage line PL connected to the first power supply line 160, and the second power supply voltage ELVSS may be provided to an opposite electrode (not shown) of the pixel P connected to the second power supply line 170.

A data driving circuit 150 is electrically connected to a signal line such as a data line DL. An electrical signal such as a data signal Dm of the data driving circuit 150 may be provided to each pixel P via a third connection line 151 connected to the first terminal 140 and the data line DL connected to the third connection line 151. FIG. 4 illustrates that the data driving circuit 150 is arranged on the printed circuit board PCB. However, in another embodiment, the data driving circuit 150 may be arranged on the substrate 100 and be a component of the display panel 10. In an embodiment, for example, the data driving circuit 150 may be between the first terminal 140 and the first power supply line 160.

The first power supply line 160 may include a first sub-line 162 and a second sub-line 163, which extend parallel with each other along an x-direction, with the display area DA between the first sub-line 162 and the second sub-line 163. The second power supply line 170 may have a loop shape with one open side (e.g., corresponding to the first terminal 140) and may partially surround the display area DA.

Figure 5:
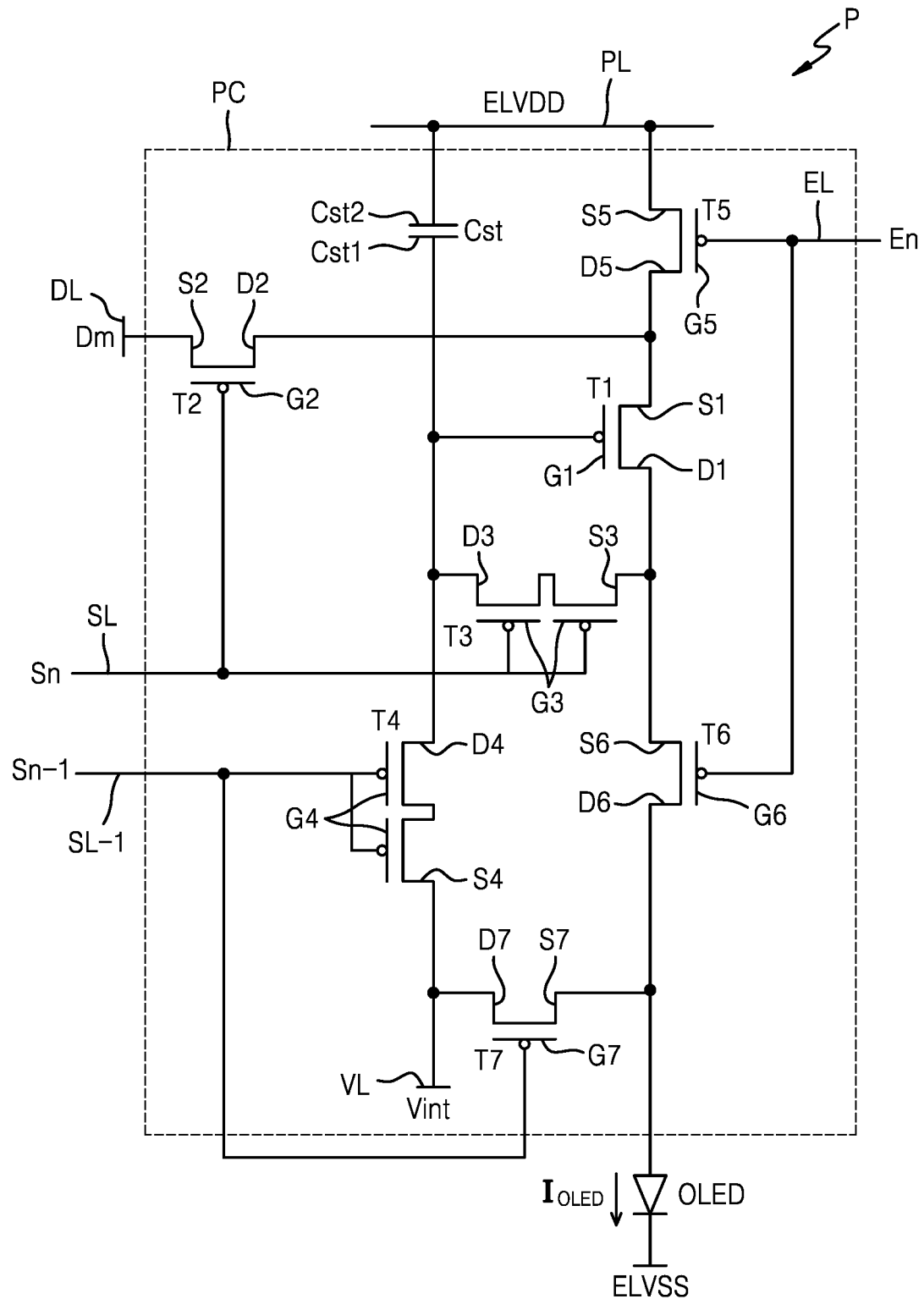
FIG. 5 is an equivalent circuit diagram illustrating an embodiment of a pixel shown in FIG. 4.

FIG. 5 is an equivalent circuit diagram illustrating an embodiment of a pixel P of the display panel 10.

Referring to FIG. 5, the pixel P may include a pixel circuit PC and a display element OLED such as an organic light-emitting diode which is connected to the pixel circuit PC. The pixel circuit PC may include a thin film transistor ("TFT") provided in plurality (e.g., a plurality of thin-film transistors) and a storage capacitor Cst. The plurality of thin-film transistors and the storage capacitor Cst may be connected to signal lines SL, SL-1, EL and DL, an initialization voltage line Vint, and the driving voltage line PL.

In FIG. 5, each pixel P is connected to the signal lines SL, SL-1, EL and DL, the initialization voltage line Vint, and the driving voltage line PL. However, embodiments are not limited thereto. In another embodiment, at least one of the signal lines SL, SL-1, EL and DL, the initialization voltage line Vint, and the driving voltage line PL may be shared by pixels P which are adjacent to each other along the display area DA.

The plurality of thin-film transistors may include a driving TFT T1, a switching TFT T2, a compensation TFT T3, a first initialization TFT T4, an operation control TFT T5, an emission control TFT T6, and a second initialization TFT T7.

The signal lines may include a scan line SL through which a scan signal Sn is transmitted, a previous scan line SL-1 through which a previous scan signal Sn-1 is transmitted to the first initialization TFT T4 and the second initialization TFT T7, an emission control line EL through which an emission control signal En is transmitted to the operation control TFT T5 and the emission control TFT T6, and a data line DL crossing the scan line SL and through which a data signal Dm is transmitted. The first power supply voltage ELVDD (e.g., a driving voltage) may be transmitted through the driving voltage line PL, to the driving TFT T1, and an initialization voltage VL for initializing the driving TFT T1 and a pixel electrode 221 of the organic light-emitting diode OLED may be transmitted through the initialization voltage line Vint.

A driving gate electrode G1 of the driving TFT T1 may be connected to a first storage capacitor plate Cst1 of the storage capacitor Cst, a driving source electrode S1 of the driving TFT T1 may be connected to the driving voltage line PL via the operation control TFT T5, and a driving drain electrode D1 of the driving TFT T1 may be electrically connected to the pixel electrode 221 of the display element OLED via the emission control TFT T6. The driving TFT T1 may receive the data signal Dm according to a switching operation of the switching TFT T2 so as to supply electrical driving current $I_{OLED}$ to the display element OLED.

A switching gate electrode G2 of the switching TFT T2 may be connected to the scan line SL, a switching source electrode S2 of the switching TFT T2 may be connected to the data line DL, and a switching drain electrode D2 of the switching TFT T2 may be connected to the driving source electrode S1 of the driving TFT T1 and may be connected the driving voltage line PL via the operation control TFT T5. The switching TFT T2 may be turned on according to the scan signal Sn received through the scan line SL and may perform a switching operation of transmitting the data signal Dm transmitted to the data line DL, to the driving source electrode S1 of the driving TFT T1.

A compensation gate electrode G3 of the compensation TFT T3 may be connected to the scan line SL, a compensation source electrode S3 of the compensation TFT T3 may be connected to the driving drain electrode D1 of the driving TFT T1 and may be connected to the pixel electrode 221 of the display element OLED via the emission control TFT T6, and a compensation drain electrode D3 of the compensation TFT T3 may be connected to the first storage capacitor plate Cst1 of the storage capacitor Cst, the first initialization drain electrode D4 of the first initialization TFT T4 and the driving gate electrode G1 of the driving TFT T1. The compensation TFT T3 may be turned on according to the scan signal Sn transmitted through the scan line SL and may electrically connect the driving gate electrode G1 and the driving drain electrode D1 of the driving TFT T1 to each other, thereby diode-connecting the driving TFT T1.

A first initialization gate electrode G4 of the first initialization TFT T4 may be connected to the previous scan line SL-1, a first initialization source electrode S4 of the first initialization TFT T4 may be connected to a second initialization drain electrode D7 of the second initialization TFT T7 and the initialization voltage line Vint, and a first initialization drain electrode D4 of the first initialization TFT T4 may be connected to the first storage capacitor plate Cst1 of the storage capacitor Cst, the compensation drain electrode D3 of the compensation TFT T3 and the driving gate electrode G1 of the driving TFT T1. The first initialization TFT T4 may be turned on according to the previous scan signal Sn-1 transmitted through the previous scan line SL-1 and may perform an initialization operation of initializing a voltage of the driving gate electrode G1 of the driving TFT T1 by transmitting the initialization voltage VL to the driving gate electrode G1 of the driving TFT T1.

An operation control gate electrode G5 of the operation control TFT T5 may be connected to the emission control line EL, an operation control source electrode S5 of the operation control TFT T5 may be connected to the driving voltage line PL, and an operation control drain electrode D5 of the operation control TFT T5 may be connected to the driving source electrode S1 of the driving TFT T1 and the switching drain electrode D2 of the switching TFT T2.

An emission control gate electrode G6 of the emission control TFT T6 may be connected to the emission control line EL, an emission control source electrode S6 of the emission control TFT T6 may be connected to a driving drain electrode D1 of the driving TFT T1 and a compensation source electrode S3 of the compensation TFT T3, and an emission control drain electrode D6 of the emission control TFT T6 may be electrically connected to a second initialization source electrode S7 of the second initialization TFT T7 and the pixel electrode 221 of the display element OLED.

The operation control TFT T5 and the emission control TFT T6 may be simultaneously turned on according to the emission control signal En transmitted through the emission control line EL, such that the first power supply voltage ELVDD (or the driving voltage) may be transmitted to the display element OLED and the electrical driving current $I_{OLED}$ may flow through the display element OLED.

A second initialization gate electrode G7 of the second initialization TFT T7 may be connected to the previous scan line SL-1, the second initialization source electrode S7 of the second initialization TFT T7 may be connected to the emission control drain electrode D6 of the emission control TFT T6 and the pixel electrode 221 of the display element OLED, and the second initialization drain electrode D7 of the second initialization TFT T7 may be connected to the first initialization source electrode S4 of the first initialization TFT T4 and the initialization voltage line Vint. The second initialization TFT T7 may be turned on according to the previous scan signal Sn-1 transmitted through the previous scan line SL-1 and may initialize the pixel electrode 221 of the display element OLED.

In FIG. 5, the first initialization TFT T4 and the second initialization TFT T7 are connected to the previous scan line SL-1. However, embodiments are not limited thereto. In another embodiment, the first initialization TFT T4 may be connected to the previous scan line SL-1 and may be driven according to the previous scan signal Sn-1, and the second initialization TFT T7 may be connected to an additional signal line (for example, a subsequent scan line) and may be driven according to a signal transmitted to the additional signal line.

A second storage capacitor plate Cst2 of the storage capacitor Cst may be connected to the driving voltage line PL, and an opposite electrode 223 of the display element OLED may be connected to the second power supply voltage ELVSS (or a common voltage). Thus, the display element OLED may receive the electrical driving current $I_{OLED}$ from the driving TFT T1 and may emit light, thereby displaying an image.

In FIG. 5, the compensation TFT T3 and the first initialization TFT T4 have a dual gate electrode. However, in another embodiment, the compensation TFT T3 and the first initialization TFT T4 may have one gate electrode.

Figure 6A:
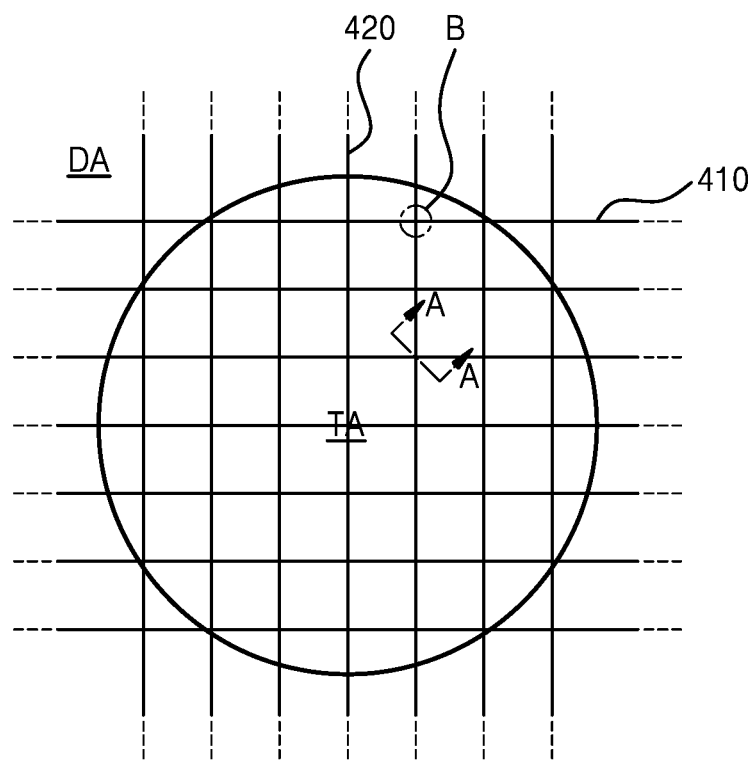
FIGS. 6A and 6B are top plan views illustrating an embodiment of lines relative to a component area in the display device shown in FIG. 1.
Figure 6B:
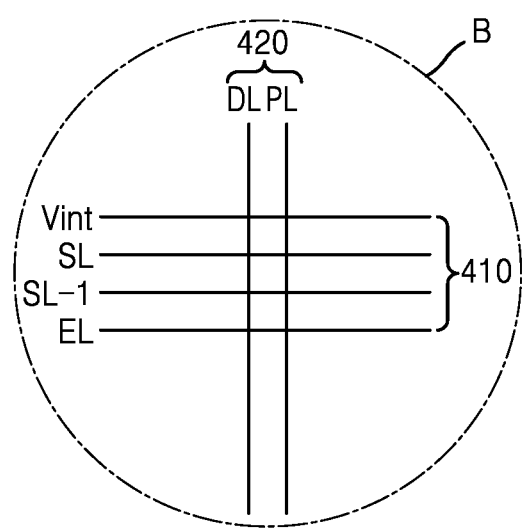
Figure 7:
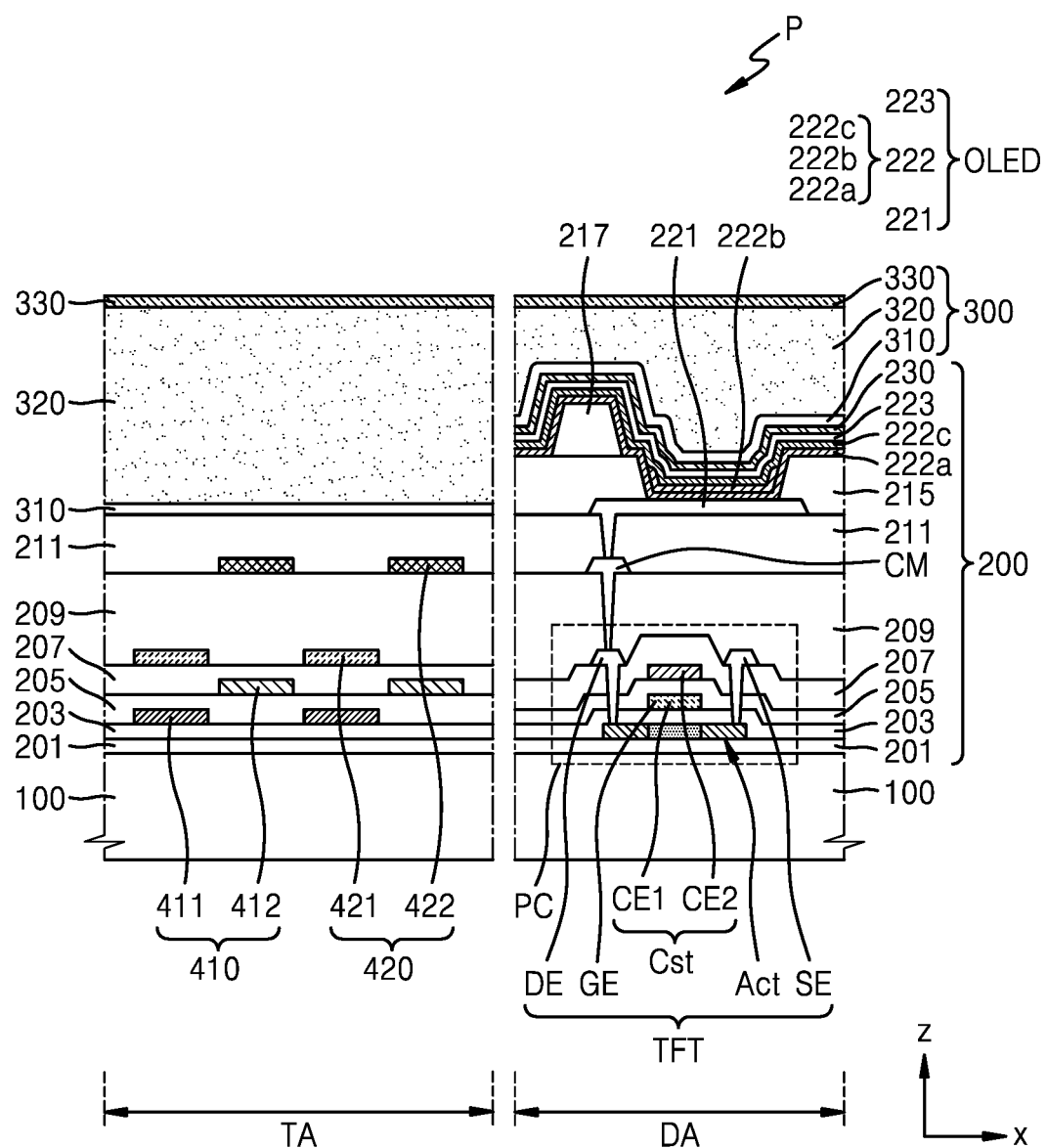
FIG. 7 is a cross-sectional view taken along line A-A of FIG. 6A, together with a cross-section of a pixel of a display area.

Now, a line structure relative to the transmission area TA will be described with reference to FIGS. 6A, 6B and 7. FIG. 6A is an enlarged top plan view illustrating an embodiment of lines relative to the transmission area TA in the display device 1 shown in FIG. 1, FIG. 6B is an enlarged to plan view of lines at region B of FIG. 6A, and FIG. 7 is an enlarged cross-sectional view showing a cross-section along line A-A of at the transmission area TA in FIG. 6A together with a cross-section of a pixel P outside of the transmission area TA and within the display area DA.

First, a plurality of pixels P may be arranged around the transmission area TA. That is, as described above, the transmission area TA may be in the display area DA and thus may be surrounded by the plurality of pixels P. The transmission area TA may include no pixels P.

A plurality of lines is connected to the plurality of pixels P. The plurality of lines may include a first line 410 as a group of individual signal lines, and a second line 420 are a group of individual signal lines. As shown in FIG. 6A, the first line 410 and the second line 420 may pass through the transmission area TA. The first line 410 and the second line 420 may pass through the transmission area TA to be connected to pixels P in the display area DA. Since the first line 410 and the second line 420 extend across the transmission area TA, the pixels P connected to such lines may be disposed at opposing sides of the transmission area TA.

If the substrate 100 defined the transmission area TA as a hole provided by drilling or perforation, the first line 410 and the second line 420 bypass the hole since a portion of the substrate 100 is absent at the hole, such that the first line 410 and the second line 420 cannot be disposed on the substrate 100 at the transmission area TA. However, in one or more embodiment, only the pixels P are absent at the transmission area TA, such that various layers of the display panel 10 are stacked at the substrate 100 excluding the hole. Therefore, the first line 410 and the second line 420 may be disposed on the substrate 100 at the transmission area TA. Thus, an additional planar area outside of the transmission area TA (e.g., around a hole of the substrate 100 at which the lines bypass the hole), is obviated. Thus, a dead space (e.g., non-display region) immediately adjacent to the transmission area TA may be reduced.

However, since signal transmission/reception of the component 20, such as a camera, is performed at the transmission area TA, the first line 410 and the second line 420 are arranged in a mesh shape shown in FIG. 6A. The mesh shape is defined by solid portions of signal lines crossing and spaced apart from each other, to define openings or spaces which are between solid portions. At the openings or spaces within the transmission area TA, a signal related to the component 20 may be transmittable through the substrate 100 and various layers of the display panel 10 which are on the substrate 100 since there is minimal solid portion and none of the pixels P. As such, the transmission area TA defines planar areas (e.g., openings or spaces) at which a signal may be transmittable to communicate with the component 20.

Hereinafter, lines extended along a first direction (e.g., horizontal or transverse direction of FIGS. 6A and 6B), and extended along a second direction (e.g., vertical or longitudinal direction of FIGS. 6A and 6B) will be referred to as a first line 410 and a second line 420, respectively. For convenience, each of the first line 410 and the second line 420 that cross each other to form the mesh shape of FIG. 6A, is shown as a single line. However, as shown in the enlarged view of FIG. 6B, each of the first line 410 and the second line 420 may include a plurality of individual signal lines.

As individual signal lines in a first group of lines, the scan lines SL and SL-1, the emission control line EL, and the initialization voltage line Vint are included in the first line 410. As individual signal lines in a second group of lines, the driving voltage line PL and the data line are included in the second line 420. For convenience of description, since the previous scan line SL-1 is also generally a scan signal line, hereinafter, SL and SL-1 will be commonly called scan lines SL and SL-1.

That is, the scan lines SL and SL-1, the emission control line EL, and the initialization voltage line Vint may be extended along the first direction and arranged adjacent to each other along the second direction. The driving voltage line PL and the data line DL may be extended along the second direction and arranged adjacent to each other along the first direction, to cross each of the scan lines SL and SL-1, the emission control line EL, and the initialization voltage line Vint and form a mesh shape defining openings or spaces therebetween. That is, the transmission area TA defines planar areas (e.g., openings or spaces) at which a signal may communicate with the component 20 without adding a planar area (e.g., non-display region) adjacent to the transmission area TA at which the lines bypass the transmission area TA.

All of the individual lines in the first line 410 and the second line 420 which cross each other may not be arranged in a same layer within the display panel 10, but may be distributed among several layers within the display panel 10, as shown in FIG. 7. That is, the first line 410 and the second line 420 are distributed between a variety of insulating layers (e.g., a first insulating layer, a second insulating layer, a third insulating layer, etc.) stacked on the substrate 100. In an embodiment, for example, the scan lines SL and SL-1 and the emission control line EL may be arranged along the substrate 100 in a first lower-layer line (e.g., first lower line 411) of the first line 410, the initialization voltage line Vint may be arranged along the substrate 100 in an first upper-layer line (e.g., first upper line 412) of the first line 410, the data line DL may be arranged in a second lower-layer line (e.g., second lower line 421) of the second line 420, and the driving voltage line PL may be arranged in a second upper-layer line (e.g., second upper line 422) of the second line 420.

The first line 410 and the second line 420 in the transmission area TA may be provided or formed together when a variety of electrodes included in the pixels P in the display area DA are provided or formed. In order to explain this, a cross-sectional stack structure of the pixel P will be described with reference to the display area DA, in the right side view of FIG. 7.

By referring to the display area DA of FIG. 7, the substrate 100 may include a glass material or polymer resin. In an embodiment, the substrate 100 may include a plurality of sub-layers, as shown in the enlarged view of FIG. 3B described above.

A buffer layer 201 may be provided or formed on the substrate 100 so as to reduce or effectively prevent an impurity from penetrating into the semiconductor layer Act of a thin-film transistor TFT. The buffer layer 201 may include an inorganic insulating material, such as silicon nitride, silicon oxynitride, and silicon oxide, and may have a single layer or multi-layer structure including the inorganic insulating materials described above.

A pixel circuit PC may be arranged on the buffer layer 201. The pixel circuit PC may include a thin-film transistor TFT and a storage capacitor Cst. The thin-film transistor TFT may include the semiconductor layer Act, a gate electrode GE, a source electrode SE, and a drain electrode DE. The thin-film transistor TFT shown in FIG. 7 may correspond to the driving TFT shown in FIG. 5. In the present embodiment, a top gate-type TFT in which a gate electrode GE is arranged on a top of a semiconductor layer Act with a gate insulating layer 203 between the gate electrode GE and the semiconductor layer Act, is shown. However, in another embodiment, the thin-film transistor TFT may be of a bottom gate-type.

The semiconductor layer Act may include polysilicon. Alternatively, the semiconductor layer Act may include amorphous silicon, an oxide semiconductor, or an organic semiconductor. The gate electrode GE may include a relatively low-resistance metal material. The gate electrode GE may include conductive materials including molybdenum (Mo), aluminum (Al), copper (Cu), and titanium (Ti) and may have a single layer or multi-layer structure including the materials described above.

The gate insulating layer 203 between the semiconductor layer Act and the gate electrode GE may include inorganic insulating materials, such as silicon oxide, silicon nitride, silicon oxynitride, aluminum oxide, titanium oxide, tantalum oxide, and hafnium oxide. The gate insulating layer 203 may have a single layer or multi-layer structure including the materials described above.

The source electrode SE and the drain electrode DE may include materials having conductivity. The source electrode SE and the drain electrode DE may include conductive materials including Mo, Al, Cu, and Ti and may have a single layer or multi-layer structure including the materials described above. In an embodiment, the source electrode SE, the drain electrode DE, and the data line DL may have a multi-layer structure of Ti/Al/Ti.

The storage capacitor Cst may include a lower electrode CE1 and an upper electrode CE2 that overlap each other with a first interlayer insulating layer 205 therebetween. The storage capacitor Cst may overlap the thin-film transistor TFT. In this regard, FIG. 7 illustrates that the gate electrode GE of the thin-film transistor TFT is the lower electrode CE1 of the storage capacitor Cst. In another embodiment, the storage capacitor Cst may not overlap the thin-film transistor TFT. The storage capacitor Cst may be covered by a second interlayer insulating layer 207. The upper electrode CE2 of the storage capacitor Cst may include conductive materials including Mo, Al, Cu, and Ti and may have a single layer or multi-layer structure including the materials described above.

The first interlayer insulating layer 205 and the second interlayer insulating layer 207 may include inorganic insulating materials, such as silicon oxide, silicon nitride, silicon oxynitride, aluminum oxide, titanium oxide, tantalum oxide, and hafnium oxide. The first interlayer insulating layer 205 and the second interlayer insulating layer 207 may have a single layer or multi-layer structure including the materials described above.

The pixel circuit PC including the thin-film transistor TFT and the storage capacitor Cst may be covered by a first organic insulating layer 209 (e.g., first organic layer). The first organic insulating layer 209 may have an approximately flat top surface.

The pixel circuit PC may be electrically connected to the pixel electrode 221. In an embodiment, for example, a contact metal layer CM (e.g., conductive contact or conductive pattern) may be between the thin-film transistor TFT and the pixel electrode 221, as shown in FIG. 7. The contact metal layer CM may be connected to the thin-film transistor TFT at or via a contact hole defined or formed in the first organic insulating layer 209. The pixel electrode 221 may be connected to the contact metal layer CM at or via a contact hole defined or formed in a second organic insulating layer 211 (e.g., second organic layer) above the contact metal layer CM. The contact metal layer CM may include a conductive material including Mo, Al, Cu, and Ti and may have a single layer or multi-layer structure including the materials described above. In an embodiment, the contact metal layer CM may have a multi-layer structure of Ti/Al/Ti.

The first organic insulating layer 209 and the second organic insulating layer 211 may include organic insulating materials, such as a polymer such as polymethylmethacrylate ("PMMA") or polystyrene ("PS"), a polymer derivative having a phenol-based group, acryl-based polymer, imide-based polymer, aryl ether-based polymer, amide-based polymer, fluorine-based polymer, p-xylene-based polymer, vinyl alcohol-based polymer, or a combination thereof. In an embodiment, the first organic insulating material 209 and the second organic insulating material 211 may include polyimide.

The pixel electrode 221 may be provided or formed on the second organic insulating layer 211. The pixel electrode 221 may include a conductive material like a conductive oxide, such as indium tin oxide ("ITO"), indium zinc oxide ("IZO"), zinc oxide ("ZnO"), indium oxide ($In_2O_3$), indium gallium oxide ("IGO"), or aluminum zinc oxide ("AZO"). In another embodiment, the pixel electrode 221 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a combination thereof. In another embodiment, the pixel electrode 221 may further include a layer including ITO, IZO, ZnO, or $In_2O_3$ on/under the reflective layer described above.

A pixel-defining layer 215 may be provided or formed on the pixel electrode 221. The pixel-defining layer 215 may include or define an opening for exposing a top surface of the pixel electrode 221 and may cover outer edges of the pixel electrode 221. The pixel-defining layer 215 may include an organic insulating material. Alternatively, the pixel-defining layer 215 may include an inorganic insulating material, such as silicon nitride (SiNx), silicon oxynitride (SiON), or silicon oxide (SiOx). Alternatively, the pixel-defining layer 215 may include the organic insulating material and the inorganic insulating material.

An intermediate layer 222 may include an emission layer 222b (e.g., light emission layer). The intermediate layer 222 may include a first functional layer 222a under the emission layer 222b and/or a second functional layer 222c on the emission layer 222b. The emission layer 222b may include a polymer or relatively small molecular weight organic material that emits light of a color.

The first functional layer 222a may have a single layer or multi-layer structure. In an embodiment, for example, when the first functional layer 222a includes a polymer material, the first functional layer 222a may be a hole transport layer ("HTL") having a single layer structure and may include poly-(3,4)-ethylene-dihydroxy thiophene ("PEDOT") or polyaniline ("PANI"). When the first functional layer 222a includes a relatively small molecular weight material, the first functional layer 222a may include a hole injection layer ("HIL") and an HTL.

The second functional layer 222c may be omitted. In an embodiment, for example, when the first functional layer 222a and the emission layer 222b include polymer materials, the second functional layer 222c may be provided or formed. The second functional layer 222c may have a single layer or multi-layer structure. The second functional layer 222c may include an electron transport layer ("ETL") and/or an electron injection layer ("EIL").

The emission layer 222b of the intermediate layer 222 may be arranged in each one of the pixels P in the display area DA. The emission layer 222b may be patterned so as to define patterns respectively corresponding to the pixel electrode 221. Unlike in the emission layer 222b, the first functional layer 222a and/or the second functional layer 222c may extend into a planar area between the display area DA and the transmission area TA, in addition to being provided in the display area DA at the pixels P thereof.

The opposite electrode 223 may include a conductive material having a relatively small work function. In an embodiment, for example, the opposite electrode 223 may include a (semi-)transparent layer including Ag, Mg, Al, Pt, Pd, Au, Ni, Nd, Ir, Cr, lithium (Li), calcium (Ca), or an alloy thereof. Alternatively, the opposite electrode 223 may further include a layer, such as ITO, IZO, ZnO, or $In_2O_3$, on the (semi-)transparent layer including the materials described above. The opposite electrode 223 may be provided or formed in a planar area between the display area DA and the transmission area TA, in addition to being provided in the display area DA at the pixels P thereof. In an embodiment of manufacturing a display device 1, the first functional layer 222a, the second functional layer 222c and the opposite electrode 223 may be provided or formed through thermal deposition.

A capping layer 230 may be arranged on the opposite electrode 223. In an embodiment, for example, the capping layer 230 may include lithium fluoride (LiF) and may be provided or formed through thermal deposition. In some embodiments, the capping layer 230 may be omitted.

A spacer 217 may be provided or formed on the pixel-defining layer 215. The spacer 217 may include an organic insulating material, such as polyimide. Alternatively, the spacer 217 may include an inorganic insulating material, or an organic insulating material and an inorganic insulating material.

The spacer 217 may include a different material from a material for providing or forming the pixel-defining layer 215, or the same material as the material for providing or forming the pixel-defining layer 215. In an embodiment, the pixel-defining layer 215 and the spacer 217 may include polyimide. In an embodiment of manufacturing a display device 1, the pixel-defining layer 215 and the spacer 217 may be provided or formed together in a mask process using a halftone mask, from a same material layer. That is the pixel-defining layer 215 and the spacer 217 may be respective portions of a same material layer on the substrate 100.

The display element OLED may be covered by a thin-film encapsulation layer 300. The thin-film encapsulation layer 300 may include at least one organic encapsulation layer and at least one inorganic encapsulation layer. FIG. 7 illustrates that the thin-film encapsulation layer 300 includes a first inorganic encapsulation layer 310 (e.g., first inorganic layer) and a second inorganic encapsulation layer 330 (e.g., second inorganic layer) facing each other along the thickness direction of the display panel 10, and an organic encapsulation layer 320 (e.g., organic layer) therebetween. In another embodiment, the number of organic encapsulation layers, the number of inorganic encapsulation layers, and/or a stack order may be changed.

The first inorganic encapsulation layer 310 and the second inorganic encapsulation layer 330 may include one or more inorganic materials from among aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation 330 may have a single layer or multi-layer structure including the materials described above. The organic encapsulation layer 320 may include a polymer-based material. The polymer-based material may include acryl-based resin, epoxy-based resin, polyimide, and polyethylene. In an embodiment, the organic encapsulation layer 320 may include acrylate.

Thicknesses of the first inorganic encapsulation layer 310 and the second inorganic encapsulation layer 330, along the thickness direction of the display panel 10, may be different from each other. The thickness of the first inorganic encapsulation layer 310 may be greater than the thickness of the second inorganic encapsulation layer 330. Alternatively, the thickness of the second inorganic encapsulation layer 330 may be greater than the thickness of the first inorganic encapsulation layer 310, or the thicknesses of the first inorganic encapsulation layer 310 and the second inorganic encapsulation layer 330 may be the same.

A variety of insulating layers (e.g., buffer layer 201, gate insulating layer 203, first interlayer insulating layer 205, second interlayer insulating layer 207, first organic insulating layer 209, and second organic insulating layer 211 and encapsulation layers) in the pixel P described above are stacked on the substrate 100, in both the display area DA and the transmission area TA. The first line 410 and the second line 420 described above are arranged between the various insulating layers.

The scan lines SL and SL-1 and the emission control line EL as the first lower line 411 of the first line 410, and the gate electrode GE, are in a same layer among material layers on the substrate 100. The initialization voltage line Vint as the first upper line 412 of the first line 410, and the upper electrode CE2, are in a same layer among material layers on the substrate 100. As being in a same layer, elements may include a same material, may be provided or formed from a same material layer and/or may be respective portions or patterns of a same material layer on the substrate 100.

The data line DL as the second lower line 421 of the second line 420, and the source electrode SE and the drain electrode DE, are in a same layer among material layers on the substrate 100. The driving voltage line PL as the second upper line 422 of the second line 420, and the contact metal layer CM, are in a same layer among material layers on the substrate 100.

Thus, according to the above-described structure, the first line 410 and the second line 420 may be provided in and pass through the transmission area TA, such that the first line 410 and the second line 420 do not bypass the transmission area TA and obviate a planar area (e.g., dead space) around the transmission area TA in which the bypassed portions of the first line 410 and the second line 420 are disposed. Since the first line 410 and the second line 420 are arranged in a mesh shape which includes openings or spaces at which solid portions of the lines are omitted, a space of the transmission area TA for communication of a signal with the component 20 may be attained.

In FIG. 7, lines in adjacent layers from among the first line 410 and the second line 420 are arranged not to overlap, except for a crossing point on a plane.

Figure 8:
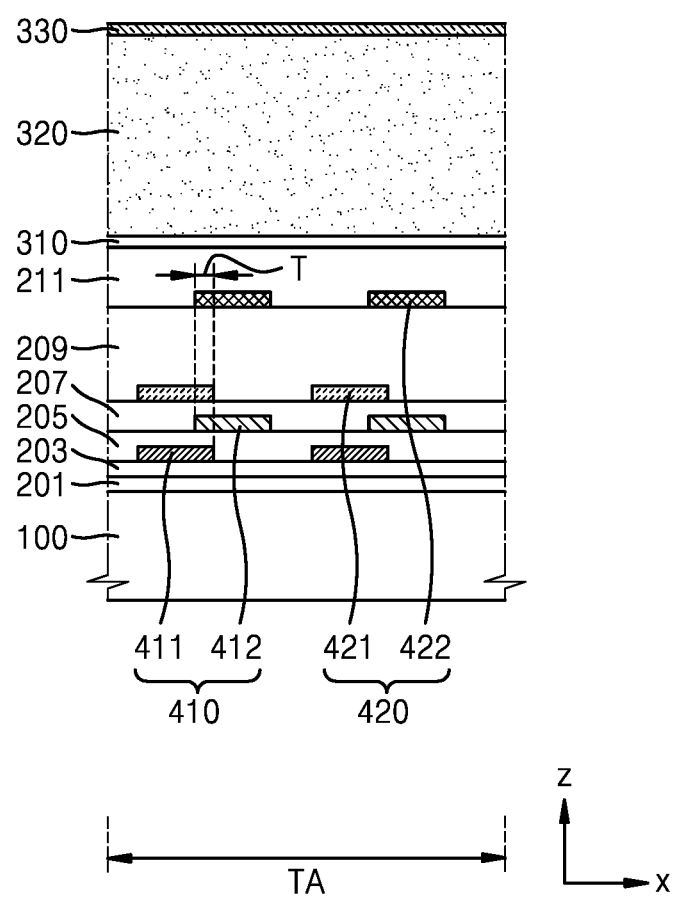
FIG. 8 is a plan view illustrating a comparative structure of lines.

As shown in FIG. 8, as a comparative structure of portions within a signal line, an overlapping section T (e.g., overlapping area) at which the first lower line 411 and the first upper line 412 overlap each other, may be provided or formed. In this case, a width of the lines (e.g., solid portions) that define the mesh shape within the transmission area TA is reduced and thus, the openings or spaces between solid portions may be increased. However, when the lines in adjacent layers overlap such as to have the overlapping section T in FIG. 7, a parasitic capacitance occurs and thus there is a risk of signal failure.

Thus, in one or more embodiment, as shown in FIG. 8, the lines within the transmission area TA may be arranged so that the number of overlapping areas may be decreased or omitted. That is, line portions within a same signal line, which are in different layers from each other, may be spaced apart from each other along the substrate 100, so as to not overlap each other.

Figure 9A:
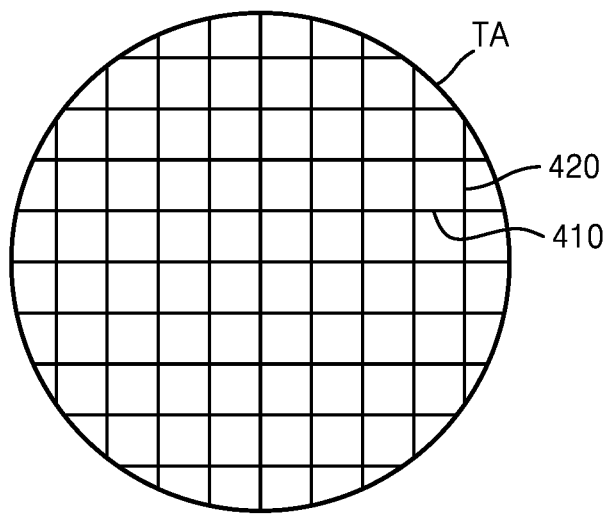
FIGS. 9A through 9C are plan views illustrating embodiments of a mesh size.
Figure 9B:
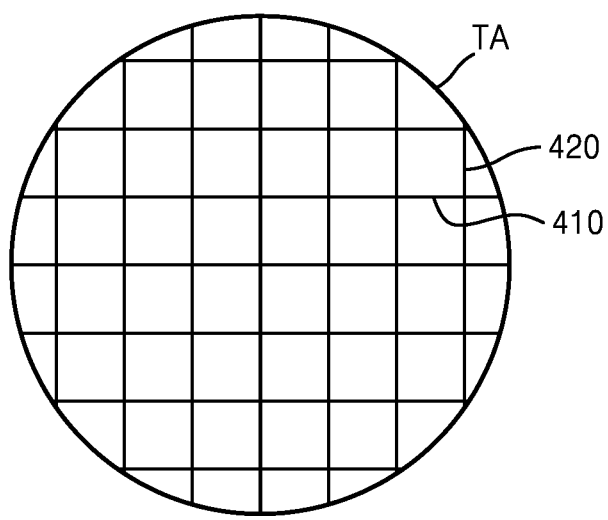
Figure 9C:
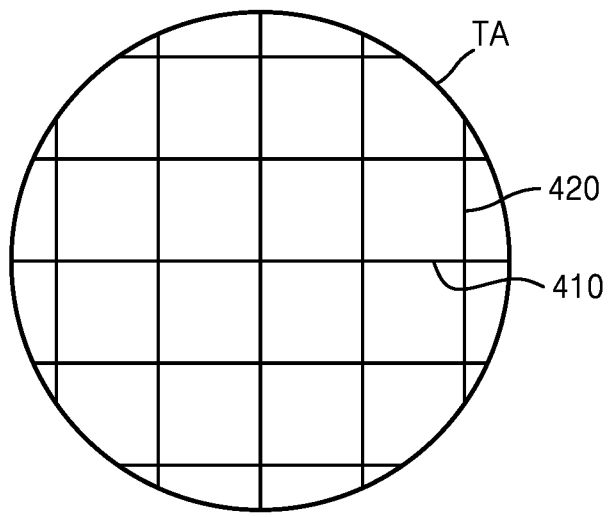

More than one of the pixel P may be arranged in a pixel group or pixel bundle. The first line 410 and the second line 420 may be connected to a pixel group or pixel bundle, rather than a single one of the pixel P. A spacing between the solid portions of the first line 410 and the second line 420, may be related to a number of the pixel P within the pixel group or pixel bundle. The spacing between the solid portions may define a size of the mesh structure formed by the first line 410 and the second line 420 which cross each other within the transmission area TA. The size of the mesh may be variously modified, as shown in FIGS. 9A through 9C. In FIGS. 9A through 9C taken together with FIG. 4, the first line 410 and the second line 420 are considered extending along the x-direction and the Y-direction, respectively.

In an embodiment, for example, when the first line 410 and the second line 420 are connected to each other relative to two of the pixel P in a pixel bundle, a mesh structure of a relatively narrow empty space may be constituted as shown in FIG. 9A. When the first line 410 and the second line 420 are connected to each other relative to four of the pixel P in a pixel bundle, a mesh structure of a relatively wide empty space may be constituted as shown in FIG. 9C. When the first line 410 and the second line 420 are connected to each other relative to three of the pixel P in a pixel bundle, the middle-sized mesh structure as shown in FIG. 9B may be constituted. The size of the empty space or opening of the mesh structure may be variously changed depending on whether the first line 410 and the second line 420 are arranged so as to be connected to pixels P within a pixel bundle. Thus, the size of the empty space of the mesh may be adjusted to desired specifications.

The shape of the mesh in addition to the size of the mesh structure may be variously modified, as shown in FIGS. 10A through 10D. That is, as shown in FIG. 6A, even if the first line 410 and the second line 420 do not intersect with each other vertically (e.g., perpendicularly, such as the checkered mesh structure in FIGS. 9A-9C), an empty space for communication of a signal with the component 20 may still be employed.

Figure 10A:
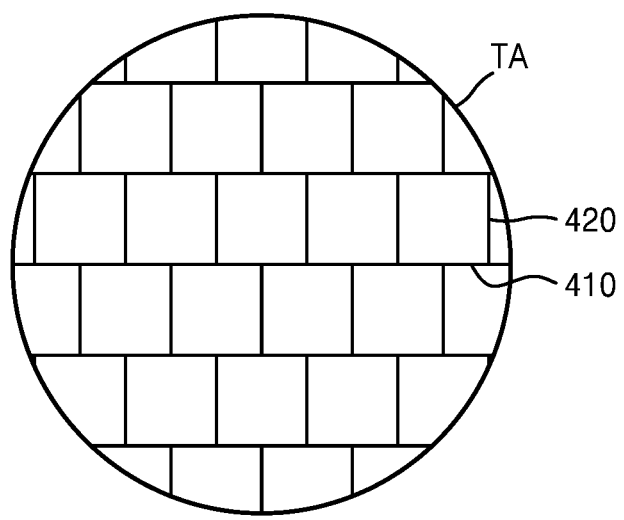
FIGS. 10A through 10D are plan views illustrating embodiments of a mesh shape.
Figure 10B:
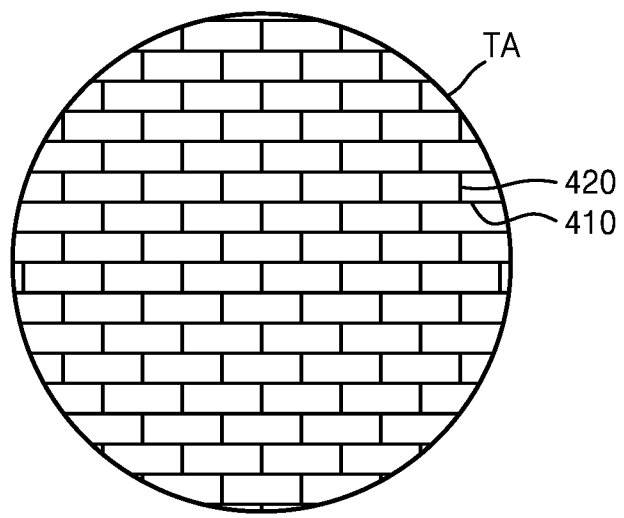

FIG. 10A illustrates a square brickwork-type mesh structure, where openings have a square planar shape, whereas FIG. 10B illustrates a rectangular brickwork-type mesh structure, where openings have a rectangular planar shape.

Figure 10C:
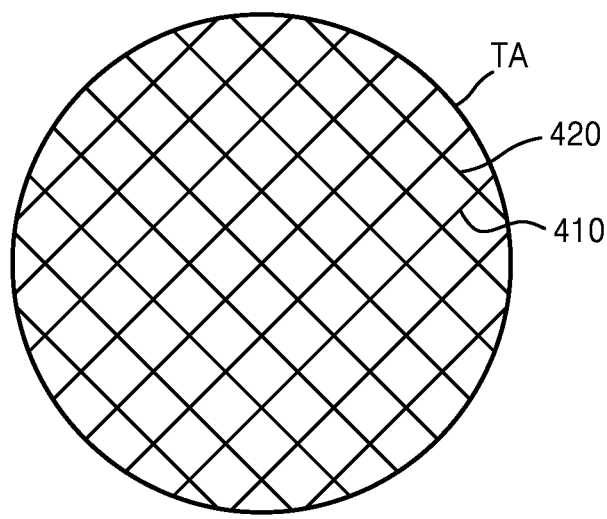
Figure 10D:
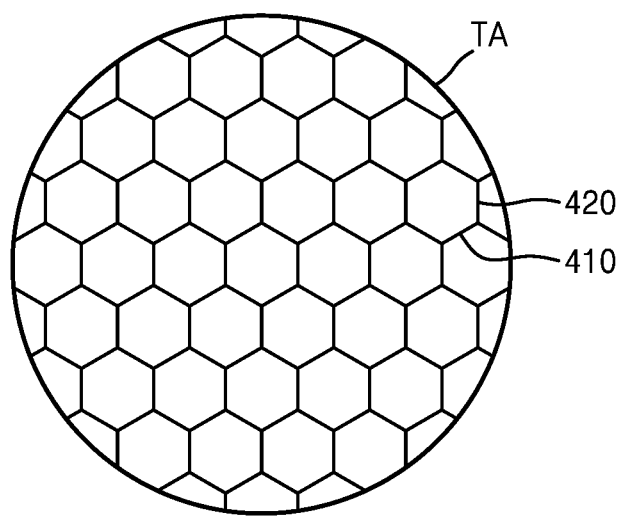

Referring to FIG. 10C taken together with FIG. 4, the first line 410 and the second line 420 are considered extending in directions inclined with respect to the x-direction and the Y-direction, respectively. FIG. 10C illustrates a rhombus-type mesh structure, where openings have a rhombus planar shape. FIG. 10D illustrates a honeycomb-type mesh structure, where openings have a hexagon shape. In this way, the shape and size of the mesh structure may be variously modified.

According to one or more embodiment of the display device 1 described above, a transmission area TA that corresponds to a component 20, such as a camera, is provided in a display area DA so that an image may be realized even around the transmission area TA. In addition, the transmission area TA is provided or formed without perforating a substrate 100 so that signal lines may be disposed on the substrate 100 at the transmission area TA and pass through the transmission area TA. Thus, an additional space around a hole in the transmission area TA for accommodating bypass of the lines around the transmission area TA, may be reduced.

It should be understood that embodiments described herein should be considered in a descriptive sense only and not for purposes of limitation. Descriptions of features within each embodiment should typically be considered as available for other similar features in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
 a substrate comprising:
  a display area including a plurality of pixels; and
  a transmission area inside the display area and corresponding to a component which uses light or sound to perform a function relative to the display device; and
 a plurality of signal lines on the substrate and connected to the plurality of pixels,
 wherein
 the plurality of signal lines pass through the transmission area of the substrate to be connected to the plurality of pixels in the display area, and
 the plurality of signal lines comprises:
  a first line which passes through the transmission area along a first direction, and
  a second line which passes through the transmission area along a second direction which crosses the first direction.

2. The display device of claim 1, wherein within the transmission area:
 the first line and the second line are each provided in plurality to form a mesh shape in the transmission area, and
 the mesh shape comprises any one of a checkered-type mesh shape, a rhombus-type mesh shape, a square brickwork-type mesh shape, a rectangular brickwork-type mesh shape and a honeycomb-type mesh shape.

3. The display device of claim 1, wherein the first line comprises:
 an initialization voltage line which provides an initialization voltage to the plurality of pixels,
 a scan line which provides a scan signal to the plurality of pixels, and
 an emission control line which provides an emission control signal to the plurality of pixels.

4. The display device of claim 3, wherein within the first line, at least one of the initialization voltage line, the scan line and the emission control line is arranged in a different layer from another one among the initialization voltage line, the scan line and the emission control line.

5. The display device of claim 4, wherein
 a pixel among the plurality of pixels in the display area comprises a semiconductor layer on the substrate, a gate electrode facing the semiconductor layer, an upper electrode forming a capacitor together with the gate electrode, a source electrode and a drain electrode each connected to the semiconductor layer, and a contact metal layer connected to the drain electrode, and the scan line and the emission control line are in a same layer as the gate electrode, and the initialization voltage line is in a same layer as the upper electrode.

6. The display device of claim 1, wherein the second line comprises:

a driving voltage line which provides a driving voltage to the plurality of pixels, and a data line which provides a data signal to the plurality of pixels.

7. The display device of claim 6, wherein within the second line, the driving voltage line and the data line are in different layers from each other.

8. The display device of claim 7, wherein a pixel among the plurality of pixels in the display area comprises a semiconductor layer on the substrate, a gate electrode facing the semiconductor layer, an upper electrode forming a capacitor together with the gate electrode, a source electrode and a drain electrode each connected to the semiconductor layer, and a contact metal layer connected to the drain electrode, and the data line is in a same layer as the source electrode and the drain electrode, and the driving voltage line is in a same layer as the contact metal layer.

9. A display device comprising:

a substrate comprising:

a display area including a plurality of pixels; and a transmission area inside the display area and corresponding to a component which uses light or sound to perform a function relative to the display device; and a plurality of signal lines on the substrate and connected to the plurality of pixels, wherein the plurality of signal lines pass through the transmission area of the substrate to be connected to the plurality of pixels in the display area, each signal line among the plurality of signal lines includes portions in different layers on the substrate, along a thickness direction of the substrate, and the portions which are in the different layers, are spaced apart from each other along the substrate.

10. A method of manufacturing a display device, the method comprising:

providing a substrate comprising:

a display area including a plurality of pixels; and a transmission area inside the display area and corresponding to a component which uses light or sound to perform a function relative to the display device; and providing a plurality of signal lines connected to the plurality of pixels in the display area, the plurality of signal lines passing through the transmission area which is inside the display area, wherein the plurality of signal lines comprises:

a first line passing through the transmission area along a first direction, and a second line passing through the transmission area along a second direction which crosses the first direction.

11. The method of claim 10, wherein within the transmission area:

the first line and the second line are each provided in plurality to form a mesh shape in the transmission area, and the mesh shape comprises any one of a checkered-type mesh shape, a rhombus-type mesh shape, a square brickwork-type mesh shape, a rectangular brickwork-type mesh shape and a honeycomb-type mesh shape.

12. The method of claim 10, wherein the first line comprises:

an initialization voltage line which provides an initialization voltage to the plurality of pixels, a scan line which provides a scan signal to the plurality of pixels, and an emission control line which provides an emission control signal to the plurality of pixels.

13. The method of claim 12, wherein within the first line, at least one of the initialization voltage line, the scan line and the emission control line is in a different layer from another one among the initialization voltage line, the scan line and the emission control line.

14. The method of claim 13, wherein a pixel among the plurality of pixels in the display area comprises a semiconductor layer on the substrate, a gate electrode facing the semiconductor layer, an upper electrode forming a capacitor together with the gate electrode, a source electrode and a drain electrode each connected to the semiconductor layer, and a contact metal layer connected to the drain electrode, and the scan line and the emission control line are in a same layer as the gate electrode, and the initialization voltage line is in a same layer as the upper electrode.

15. The method of claim 10, wherein the second line comprises:

a driving voltage line which provides a driving voltage to the plurality of pixels, and a data line which provides a data signal to the plurality of pixels.

16. The method of claim 15, wherein the driving voltage line and the data line are in different layers from each other.

17. The method of claim 16, wherein a pixel among the plurality of pixels in the display area comprises a semiconductor layer on the substrate, a gate electrode facing the semiconductor layer, an upper electrode forming a capacitor together with the gate electrode, a source electrode and a drain electrode each connected to the semiconductor layer, and a contact metal layer connected to the drain electrode, and the data line is in a same layer as the source electrode and the drain electrode, and the driving voltage line is in a same layer as the contact metal layer.

18. The method of claim 10, wherein each signal line among the plurality of signal lines includes portions in different layers on the substrate, along a thickness direction of the substrate, and the portions which are in the different layers, are spaced apart from each other along the substrate.

* * * * *